(12) United States Patent
Tanimoto et al.

(10) Patent No.: US 11,599,134 B2
(45) Date of Patent: Mar. 7, 2023

(54) LOW DROPOUT REGULATOR WITH LESS QUIESCENT CURRENT IN DROPOUT REGION

(71) Applicant: Dialog Semiconductor (UK) Limited, London (GB)

(72) Inventors: Susumu Tanimoto, Tokyo (JP); Hiroki Asano, Tokyo (JP)

(73) Assignee: Dialog Semiconductor (UK) Limited, London (GB)

( * ) Notice: Subject to any disclaimer, the term of this patent is extended or adjusted under 35 U.S.C. 154(b) by 331 days.

(21) Appl. No.: 16/881,240

(22) Filed: May 22, 2020

(65) Prior Publication Data

US 2021/0365061 A1    Nov. 25, 2021

(51) Int. Cl.
    *G05F 3/26*       (2006.01)
    *G05F 1/59*       (2006.01)

(52) U.S. Cl.
    CPC .............. *G05F 1/59* (2013.01); *G05F 3/262* (2013.01)

(58) Field of Classification Search
    CPC . G05F 1/462; G05F 1/56; G05F 1/563; G05F 1/565; G05F 1/575; G05F 1/59; G05F 3/26; G05F 3/262; H02M 1/0003; H02M 1/0009; H02M 1/0045; H03F 2203/45674; H03F 3/45183
    See application file for complete search history.

(56) References Cited

U.S. PATENT DOCUMENTS

| | | | | |
|---|---|---|---|---|
| 7,622,902 B1 * | 11/2009 | Kao | ................. | G05F 1/575 323/280 |
| 8,040,118 B2 * | 10/2011 | Cho | ................. | G05F 1/565 323/275 |
| 8,289,009 B1 * | 10/2012 | Strik | ................. | G05F 1/575 323/280 |
| 8,305,066 B2 | 11/2012 | Lin et al. | | |
| 8,716,993 B2 | 5/2014 | Kadanka | | |
| 2012/0212200 A1 | 8/2012 | Amer et al. | | |
| 2014/0247087 A1 | 9/2014 | Bhattad et al. | | |
| 2016/0282890 A1 * | 9/2016 | Malinowski | ............ | G05F 1/575 |

(Continued)

FOREIGN PATENT DOCUMENTS

DE    10 2015 205 359 A1    9/2016
DE    10 2017 205 957 A1    10/2018

OTHER PUBLICATIONS

German Office Action, File No. 10 2020 210 525.1, Applicant: Dialog Semiconductor (UK) Limited, dated Jan. 14, 2021, 8 pages.

*Primary Examiner* — Thienvu V Tran
*Assistant Examiner* — Shahzeb K Ahmad
(74) *Attorney, Agent, or Firm* — Saile Ackerman LLC; Stephen B. Ackerman

(57) ABSTRACT

A Low Dropout Regulator (LDO) with Less Quiescent Current in the Dropout Region is described, including an error amplifier configured to compare a reference voltage to an LDO output voltage across a resistive divider, a current mirror configured to mirror a first output of the error amplifier to a first and second output of the current mirror, and a comparator configured to compare the LDO output voltage to a second output of the error amplifier, which has been compared to the second output of the current mirror, and configured to output a control voltage to the error amplifier, where a low quiescent current is maintained when an LDO input voltage is near or less than the LDO output voltage.

20 Claims, 5 Drawing Sheets

(56) References Cited

U.S. PATENT DOCUMENTS

| | | |
|---|---|---|
| 2018/0292853 A1 | 10/2018 | Jefremow et al. |
| 2020/0201373 A1* | 6/2020 | Koay .................... G05F 1/59 |
| 2021/0311516 A1* | 10/2021 | Pan ..................... G05F 1/56 |

* cited by examiner ated, that can significantly decrease the quiescent current in the dropout region of the LDO compared to conventional LDOs.

It is a further object of one or more embodiments of the disclosure for the decrease in the quiescent current in the dropout region of the LDO to have less impact on the output voltage itself.

Still further, it is an object of one or more embodiments of the disclosure to simplify the design of the LDO with little area overhead.

Other objects will appear hereinafter.

The above and other objects of the present disclosure may be accomplished in the following manner. A Low Dropout Regulator (LDO) with Less Quiescent Current in the Dropout Region is described, including an error amplifier configured to compare a reference voltage to an LDO output voltage across a resistive divider, a current mirror configured to mirror a first output of the error amplifier to a first and second output of the current mirror, and a comparator configured to compare the LDO output voltage to a second output of the error amplifier, which has been compared to the second output of the current mirror, and configured to output a control voltage to the error amplifier, where a low quiescent current is maintained when an LDO input voltage is near or less than the LDO output voltage.

The above and other objects of the present disclosure may be further accomplished with a method for a Low Dropout Regulator (LDO) with less quiescent current in the dropout region. The steps include comparing a reference voltage to an LDO output voltage across a resistive divider, using an error amplifier. The steps also include mirroring a first output of the error amplifier to a first and a second output of a current mirror. The steps also include comparing the LDO output voltage to a second output of the error amplifier, which has been compared to the second output of the current mirror, and outputting a control voltage to the error amplifier.

In various embodiments, the LDO is achieved by adding a current source at the non-inverting input of the comparator, where a second output of the current mirror is compared with a second output of the error amplifier.

LOW DROPOUT REGULATOR WITH LESS QUIESCENT CURRENT IN DROPOUT REGION

FIELD

The present disclosure relates generally to a low dropout regulator (LDO). More particularly, the present invention relates to the quiescent current in the dropout region of the LDO.

BACKGROUND

A low dropout regulator (LDO) regulates the output voltage when the supply voltage is very close to the output voltage. The dropout region of the LDO is the operation region in which the input voltage is near or less than the target output voltage. The quiescent current of the LDO is the operation current when absent a load current. In the dropout region, no matter how efficient the LDO is, the LDO cannot output the exact target voltage.

FIG. 1 shows a conventional low dropout regulator. Vref is the reference voltage used to define the output voltage Vout, and 'A' is an error amplifier. This is a kind of OTA (Operational Transconductance Amplifier) but its output current depends negatively on its input voltage. R1 and R2 are resistors to generate a divided voltage from the output voltage, to make Vout equal to the desired target voltage Vref×[(R1+R2)/R1]. Imirror1 is a current mirror circuit designed to supply current to the load, and to keep the output voltage equal to the target voltage.

FIG. 2 shows an example of the current mirror circuit Imirror1, of FIG. 1. Devices P1 and P2 are PMOSFETs, and Vin is the input voltage of the LDO. Note that 'in' is the current input terminal, and 'out' is the current output to supply current to the load. Typically, the output current, source-to-drain current of P2 is more than the input current, source-to-drain current of P1. If the input current is 'm' amperes and the output current is 'n' amperes, the current mirror ratio is n/m.

The conventional LDO of FIG. 1, including FIG. 2, increases the source-to-drain current of P1, and as a result, its operation current increases, if Vin becomes near or less than the target output voltage. This means that the LDO operates in its dropout region. For a conventional current mirror circuit, the input voltage, Vin, must be sufficiently high in order to keep the desired current mirror ratio n/m. For example, in the circuit shown in FIGS. 2, P1 and P2 need to be saturated to get the desired current mirror ratio. Once Vin becomes less than a certain voltage, P2 cannot be saturated, and its source-to-drain current decreases according to the decrease of Vin. The source-to-drain current of P1 does not decrease, and P1 is always saturated, if P1 is a usual enhancement type MOSFET.

If Vin of the conventional LDO decreases, and becomes near or less than Vref×[(R1+R2)/R1], which is the target output voltage, the input current of Imirror1, namely the output current of error amplifier A, increases up to a maximum, because the feedback divided voltage of the output is kept less than Vref. In this case, if the load current is low, the operation current of the LDO can be significantly higher than the load current, which is undesirable.

SUMMARY

Accordingly, it is an object of one or more embodiments of the present disclosure to provide a Low Dropout Regu-

BRIEF DESCRIPTION OF THE DRAWINGS

The present disclosure will be more clearly understood from the following description taken in conjunction with the accompanying drawings in which like reference numerals designate similar or corresponding elements, regions and portions and in which.

DETAILED DESCRIPTION

The present disclosure proposes to keep a low quiescent current when a low input voltage is near or less than a target output voltage, in a low dropout regulator (LDO). This is achieved when the output current of an error amplifier is supplied to the input of a current mirror circuit and is controlled by the result of an indirect comparison of the output current of the LDO with the output current of the error amplifier.

Figure 1:
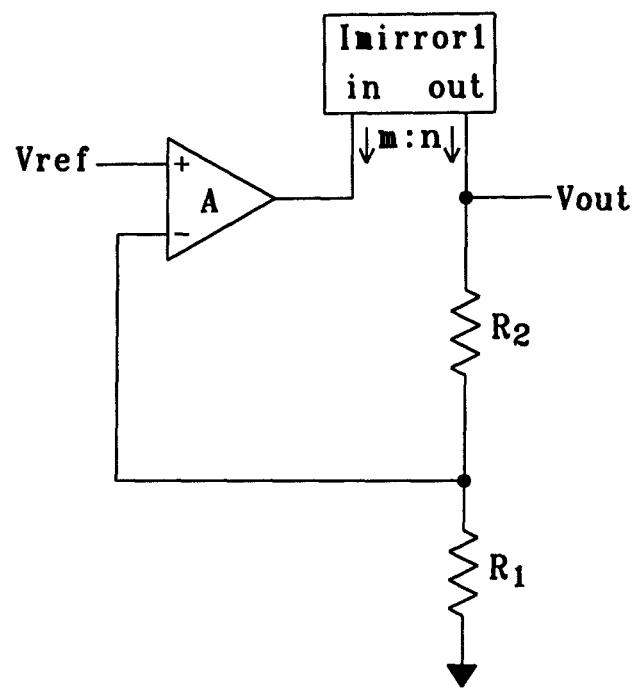
FIG. 1 shows a conventional low dropout regulator.
Figure 2:
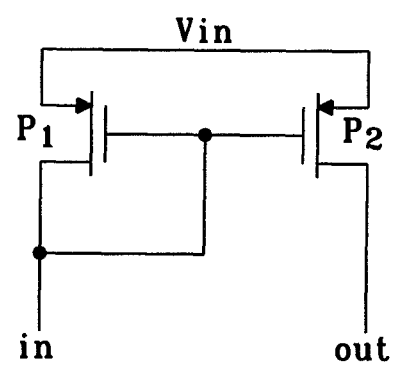
FIG. 2 shows an example of the current mirror circuit Imirror1, of FIG. 1.
Figure 3:
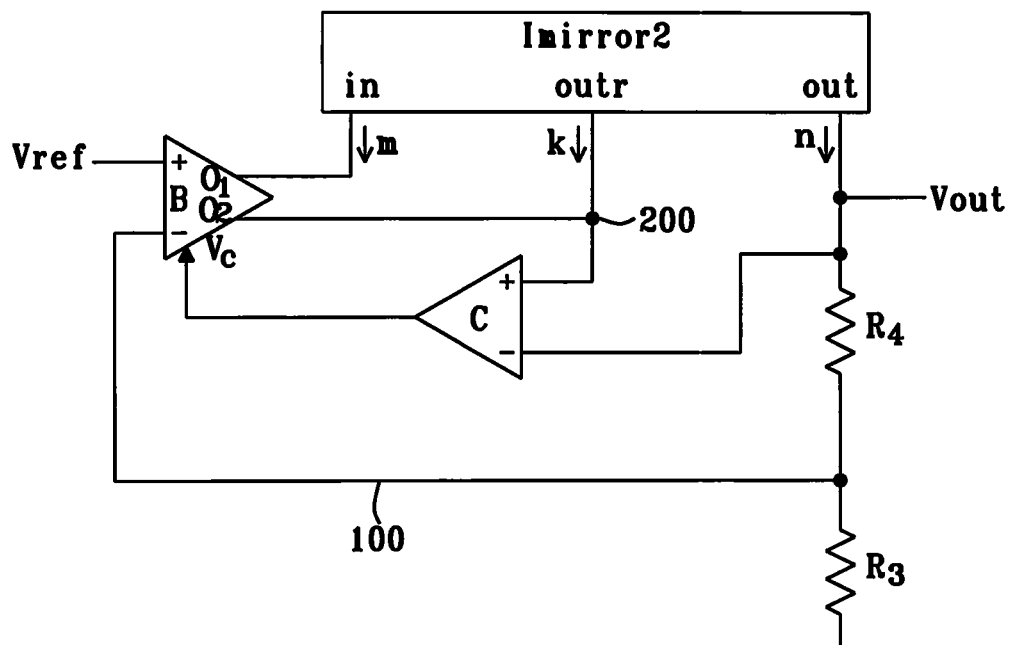
FIG. 3 shows an embodiment of the low dropout regulator of the disclosure.

FIG. 3 shows an embodiment of the low dropout regulator of the disclosure. 'B' is an error amplifier which compares reference voltage Vref, on its non-inverting input, and the divided voltage 100 of output voltage Vout, across a resistive divider comprised of resistors R3 and R4, on its inverting input. Imirror2 is a current mirror circuit. O1 is a first output current terminal of CB' and is mirrored to current mirror nodes 'out' and 'out' with fixed ratios n/m and k/m, respectively. Comparator 'C' compares node 200 on output node 'out' to Vout connected to the inverting input of 'C'.

Figure 4:
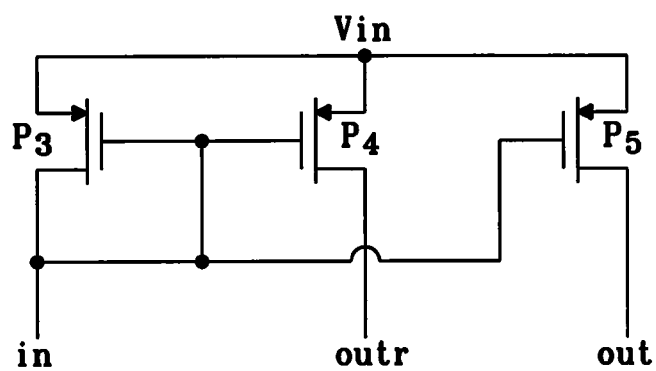
FIG. 4 discloses an example of Imirror2 of FIG. 3.

FIG. 4 shows an example of Imirror2 of FIG. 3, composed of PMOSFET devices P3, P4 and P5. Vin is the input voltage of the LDO. In this embodiment, if Vin is sufficiently high, source-to-drain currents of P4 and P5 are proportional to the source to drain current of P3, and their ratios are fixed to k/m and n/m, respectively, where k and n are the output currents of the second and third PMOSFET devices, and m is the output current of the first PMOSFET device. Therefore, if the output load current on Vout decreases, the output current of 'B' on O1 moves lower as well. Then the quiescent current of the LDO is $$[\{(n/m) \times Vout/(R3+R4)\}*(m/n+k/n+1)+Ibc+Icc].$$

Here, Ibc is the operation current of error amplifier 'B', except for the output current on first and second output current terminals O1 and O2, and Icc is the operation current of comparator 'C'. Usually Ibc and Icc are for the most part independent of input voltage Vin. Therefore, the total current of LDO is independent of Vin as well.

If Vin decreases down to around the target output voltage or less than it, current mirror ratios among P3, P4 and P5 deviate from k/m and n/m, because P4 and P5 become unsaturated. For this case, conventional LDOs increase their operation current as described above, but for the embodiment of the disclosure, the operation current does not increase.

Figure 5:
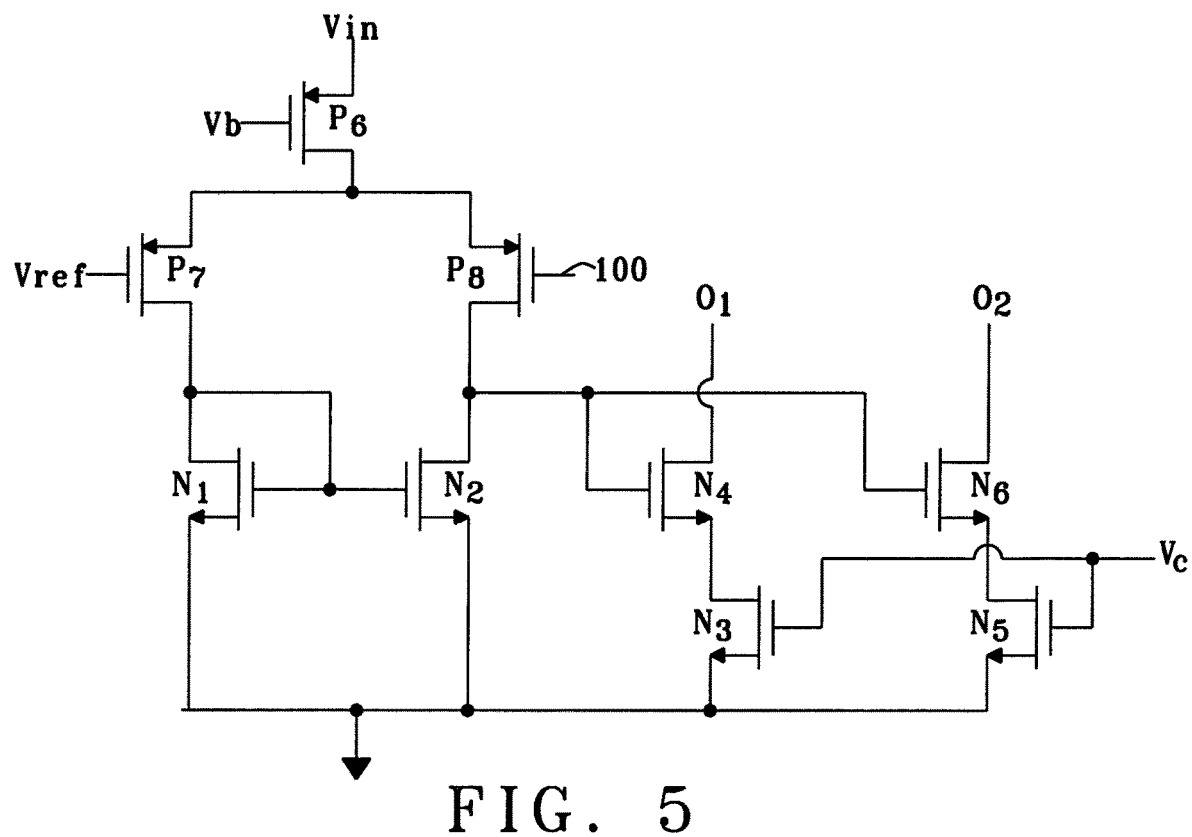
FIG. 5 shows an example of error amplifier 'B' of FIG. 3.

FIG. 5 shows an example of error amplifier CB' of FIG. 3. Vb is a bias voltage which defines the current of current source PMOSFET P6 in the input stage. Vref is a reference voltage, and 100 is the divided voltage of Vout across R3 and R4, as described above. PMOSFET devices P7 and P8 compose an input differential pair, and NMOSFET devices N1 and N2 are loads of the input stage. NMOSFET N4 and N6 are current sources, and their currents are supplied to first and second output current terminals O1 and O2 in FIG. 3, respectively. Voltage Vc is the output voltage of comparator 'C' in FIG. 3. Vc controls the maximum source-to-drain current of N4 and N6, with NMOSFET N3 and N5. In this embodiment, the ratio of the (channel width)/(channel length) of N6 to N4 is set exactly the same as, or around, k/m, which is the same as the mirror ratio of P3 and P4. The ratio of the (channel width)/(channel length) of P3 and P4 is sufficiently large enough to avoid affecting the output current on O1 and O2, if the voltage Vin is sufficiently high and higher than the target output voltage of the LDO.

In this embodiment, if Vin is just equal to the threshold voltage, which the output voltage of comparator 'C' changes from high to low, the ratio of source-to-drain current of P4 and P5 is kept exactly same as, or around, k/n even if P4 and P5 are not saturated. This is because the inverting input of comparator 'C' is Vout, and the drain voltages of P4 and P5 are exactly, or almost, equal. Namely P4 is a perfect, or almost perfect replica, of P5 at this voltage point. Therefore, comparator 'C' can precisely detect the voltage point of Vin at which the current mirror ratio of P3 and P5 starts to decrease from n/m, namely P5 goes into the dropout region. At this starting point of the dropout, voltage Vc starts to control the maximum of the source to drain currents of N4. This means that Vc starts to control all of the currents of devices P3, P4 and P5, and the operation current of the LDO. Therefore, in this embodiment of the disclosure, the quiescent current can be controlled even in the dropout region and is almost the same as that out of the dropout region, in which Vin is sufficiently larger than the target output voltage of the LDO.

Figure 6:
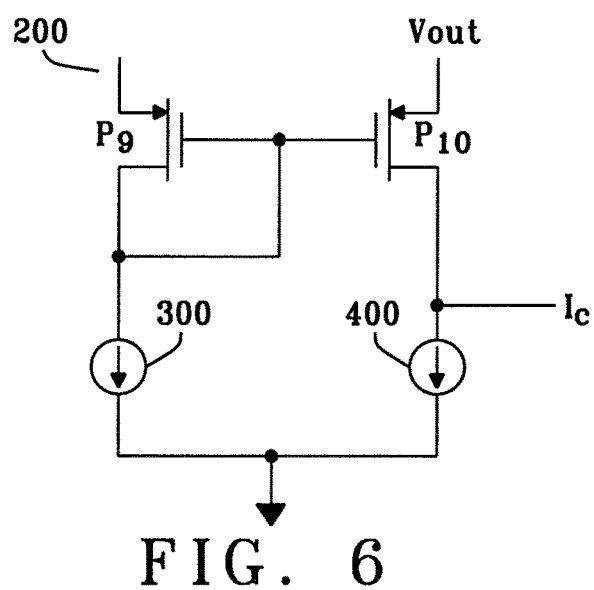
FIG. 6 discloses an example of comparator 'C' of FIG. 3.

FIG. 6 shows an example of comparator 'C' of FIG. 3. Devices P9 and P10 are PMOSFETs, and 300 and 400 are current sources. If the currents of 300 and 400 are equal, P9 and P10 should have the same channel length and width, for accurate comparison. Voltages Vout and 200 are the inverting and non-inverting inputs, respectively, of comparator 'C' as shown in FIG. 3. If the currents of 300 and 400 are not sufficiently low compared with the source-to-drain current of P5, during a no load current condition, the results of comparison 'C' might not be sufficiently accurate, because current source 300 sinks some current of the source-to-drain current of P4.

Figure 7:
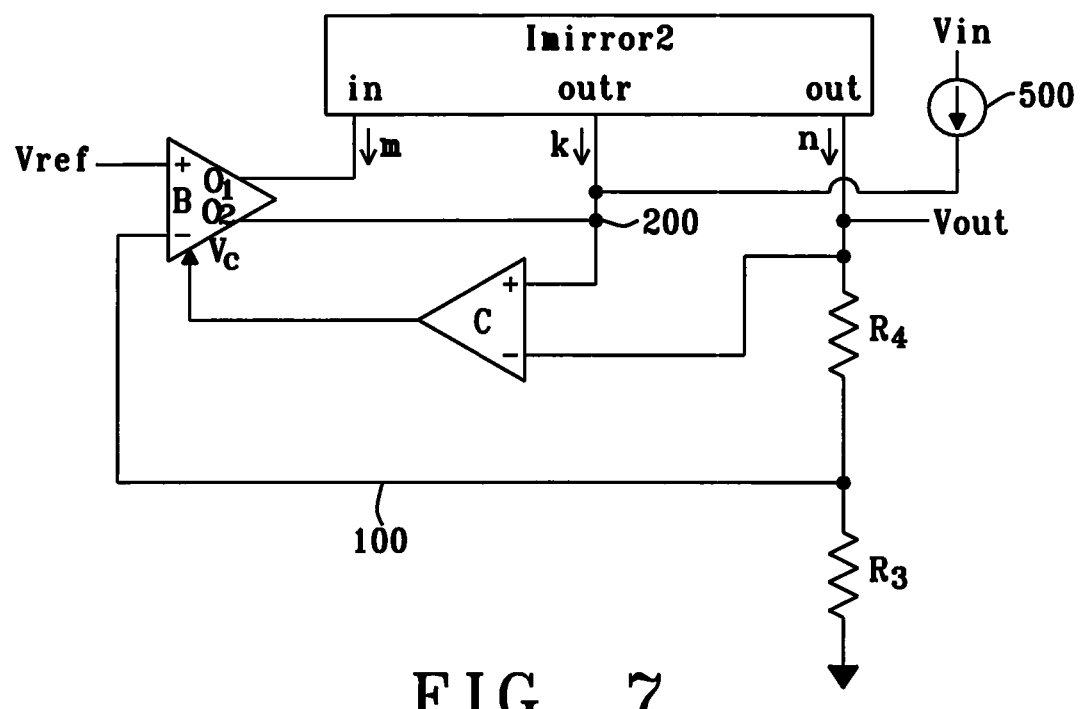
FIG. 7 shows the addition of current source 500 to FIG. 3.

This drawback can be resolved with the addition of current source 500, as shown in the embodiment of FIG. 7. The value of current source 500 should be almost equal to that of current source 300, shown in FIG. 6. The low dropout regulator of FIG. 7 shows error amplifier 'B', which compares Vref and the divided voltage 100 of output voltage Vout, on its non-inverting and inverting inputs, respectively. Current mirror circuit Imirror2 mirrors first output current terminal O1 of 'B' to nodes 'out' and 'out' with fixed ratios, n/m and k/m, respectively. Comparator 'C' compares Imirror2 output current 200 on output node 'out', connected to a second output current terminal O2 of B' and current source 500, and connected at the non-inverting input of 'C', to Vout connected to the inverting input of 'C'.

Figure 8:
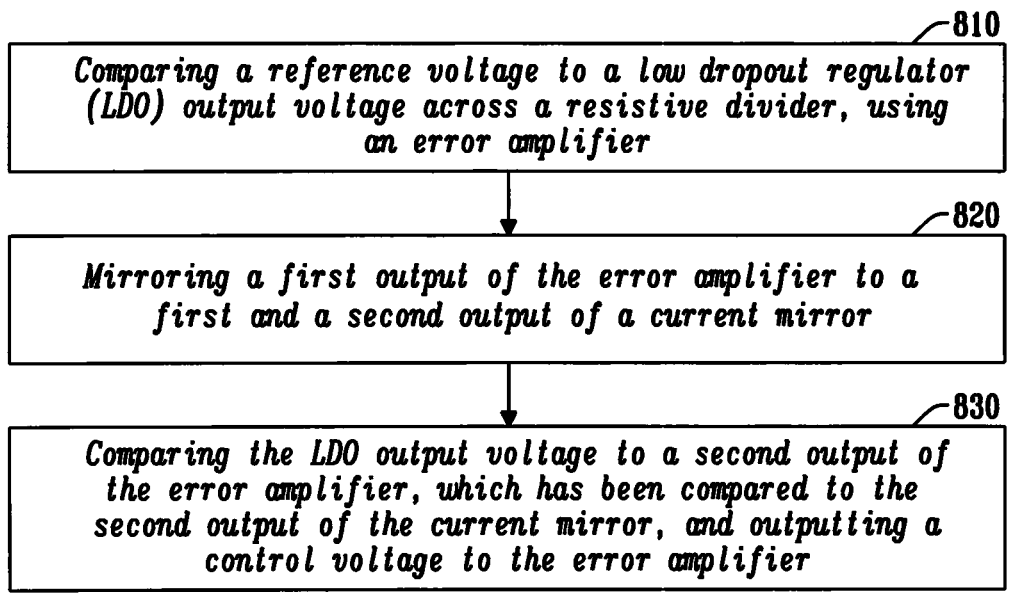
FIG. 8 is a flow chart of a method for a Low Dropout Regulator (LDO) with less quiescent current in the dropout region.

FIG. 8 is flow chart 800, of a method for a Low Dropout Regulator (LDO) with Less Quiescent Current in the Dropout Region. The steps include 810, comparing a reference voltage to an LDO output voltage across a resistive divider, using an error amplifier. The steps also include 820, mirroring a first output of the error amplifier to a first and a second output of a current mirror. The steps also include 830, comparing the LDO output voltage to a second output of the error amplifier, which has been compared to the second output of the current mirror, and outputting a control voltage to the error amplifier.

The main advantage of one or more embodiments of the present disclosure include is to provide a Low Dropout Regulator that can significantly decrease the quiescent current in the dropout region compared to conventional LDOs. Further advantages include to minimize the impact on the output voltage, and to simplify the design of the LDO itself, with little area overhead.

While particular embodiments of the present disclosure have been illustrated and described, it will be understood by those skilled in the art that various changes in form and details may be made without departing from the spirit and scope of the invention.

What is claimed is:

1. A Low Dropout Regulator (LDO) with Less Quiescent Current in the Dropout Region, comprising:

an error amplifier, configured to compare a reference voltage to an LDO output voltage across a resistive divider;

a current mirror, configured to mirror a first output of the error amplifier to a first and second output of the current mirror; and a comparator, configured to compare the LDO output voltage to a second output of the error amplifier, which has been combined with the second output of the current mirror, and configured to output a control voltage to the error amplifier, wherein a low quiescent current is maintained when an LDO input voltage is almost equal to or less than the LDO output voltage.

2. The LDO of claim 1, wherein the current mirror comprises a first, second, and third PMOSFET device, connected to an LDO input voltage at their sources, and connected to the first output of the error amplifier at their gates.

3. The LDO of claim 2, wherein the source-to-drain currents of the second and third PMOSFET devices are proportional to the source to drain current of the first PMOSFET device, and the second and third PMOSFET output current ratios are set to k/m and n/m, respectively, where k and n are the output currents of the second and third PMOSFET devices, and m is the output current of the first PMOSFET device.

4. The LDO of claim 1, wherein the error amplifier comprises a current source PMOSFET device on an input stage, PMOSFET devices configured as an input differential pair for receiving the reference voltage and LDO output voltage across a resistive divider, NMOSFET devices configured as loads on the input stage, and NMOSFET device current sources for supplying the first and second outputs of the error amplifier.

5. The LDO of claim 4, wherein the control voltage of the comparator is configured to control a maximum source-to-drain current of the NMOSFET device current sources, with a first and second NMOSFET device.

6. The LDO of claim 4, wherein the ratio of the (channel width)/(channel length) of the NMOSFET device current sources is set to k/m, which is the current mirror ratio of the first and second PMOSFET devices of the current mirror.

7. The LDO of claim 1, wherein the comparator further comprises a first and second PMOSFET device, connected at their sources to the second output of the error amplifier, which has been combined with the second output of the current mirror, and the LDO output voltage, respectively, and connected at their drains to a first and second current source, respectively.

8. The LDO of claim 7, wherein the drain of the second PMOSFET device is configured to output the control voltage to the error amplifier.

9. The LDO of claim 7, wherein the first and second PMOSFET devices are configured to have the same channel length and width, and the currents of the first and second current source are configured to be of equal value.

10. The LDO of claim 7, further comprising a third current source connected to the second output of the current mirror, and to the second output of the error amplifier, wherein the third current source is configured to be almost equal to a value of the first current source.

11. A method for operating a Low Dropout Regulator (LDO) with Less Quiescent Current in the Dropout Region, comprising:

comparing a reference voltage to an LDO output voltage across a resistive divider, using an error amplifier;

mirroring a first output of the error amplifier to a first and a second output of a current mirror; and comparing the LDO output voltage to a second output of the error amplifier, which has been combined with the second output of the current mirror, and outputting a control voltage to the error amplifier.

12. The method of claim 11, further comprising connecting a first, second, and third PMOSFET device of the current mirror to an input voltage at their sources, and connecting to the first output of the error amplifier at their gates.

13. The method of claim 12, further comprising making the source-to-drain currents of the second and third PMOSFET devices proportional to the source to drain current of the first PMOSFET device, and setting the second and third PMOSFET output current ratios to k/m and n/m, respectively, where k and n are the output currents of the second and third PMOSFET devices, and m is the output current of the first PMOSFET device.

14. The method of claim 11, further comprising configuring a current source PMOSFET device on an input stage, receiving the reference voltage and LDO output voltage across a resistive divider on PMOSFET devices configured as an input differential pair, loading the input stage with NMOSFET devices, and supplying the first and second outputs of the error amplifier with NMOSFET device current sources.

15. The method of claim 14, further comprising controlling a maximum source-to-drain current of the NMOSFET device current sources with the control voltage, and a first and second NMOSFET device.

16. The method of claim 14, further comprising setting the ratio of the (channel width)/(channel length) of the NMOSFET device current sources to k/m, which is the current mirror ratio of the first and second PMOSFET devices of the current mirror.

17. The method of claim 11, further comprising connecting a first and second PMOSFET device of the comparator at their sources to the second output of the error amplifier, which has been combined with the second output of the current mirror, and the LDO output voltage, respectively, and connecting their drains to a first and second current source, respectively.

18. The method of claim 17, further comprising outputting the control voltage to the error amplifier, on the second PMOSFET device.

19. The method of claim 17, further comprising having the same channel length and width on the first and second PMOSFET devices, where the currents of the first and second current source are of equal value.

20. The method of claim 17, further comprising connecting a third current source to the second output of the current mirror, which has been combined with the second output of the error amplifier, where the third current source is almost equal to a value of the first current source.

* * * * *